US009761553B2

(12) United States Patent
Jou et al.

(10) Patent No.: US 9,761,553 B2
(45) Date of Patent: Sep. 12, 2017

(54) INDUCTOR WITH CONDUCTIVE TRACE

(71) Applicant: Taiwan Semiconductor Manufacturing Company Limited, Hsin-Chu (TW)

(72) Inventors: Chewn-Pu Jou, Hsinchu (TW); Chuei-Tang Wang, Taichung (TW); Fu-Lung Hsueh, Kaohsiung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 45 days.

(21) Appl. No.: 13/655,695

(22) Filed: Oct. 19, 2012

(65) Prior Publication Data
US 2014/0111273 A1    Apr. 24, 2014

(51) Int. Cl.
*H01F 5/00*   (2006.01)
*H01F 27/28*  (2006.01)
*H01F 27/29*  (2006.01)
*H01F 17/06*  (2006.01)
*H01L 27/08*  (2006.01)
(Continued)

(52) U.S. Cl.
CPC ......... *H01L 24/18* (2013.01); *H01F 17/0033* (2013.01); *H01F 41/046* (2013.01); *H01L 23/645* (2013.01); *H01L 25/16* (2013.01); *H01L 23/3128* (2013.01); *H01L 2224/12105* (2013.01); *H01L 2224/24195* (2013.01); *H01L 2924/14* (2013.01); *H01L 2924/19042* (2013.01); *H01L 2924/19105* (2013.01); *H01L 2924/30107* (2013.01); *Y10T 29/4902* (2015.01)

(58) Field of Classification Search
CPC ........ H01F 17/0013; H01F 5/00; H01F 5/003; H01F 41/041; H01F 27/2804; H01F 17/0033; H01F 41/046; H01L 24/18; H01L 23/645
USPC .......................... 336/200, 192, 178, 221, 232
See application file for complete search history.

(56) References Cited

U.S. PATENT DOCUMENTS 5,387,551 A * 2/1995 Mizoguchi .............. H01F 41/02
                                              148/DIG. 12
6,303,971 B1 * 10/2001 Rhee ............................ 257/531
(Continued)

OTHER PUBLICATIONS

"Inductor", Retrieved on Sep. 7, 2012, pp. 1-16, http://en.wikipedia.org/wiki/Inductor.

*Primary Examiner* — Shawki S Ismail
*Assistant Examiner* — Kazi Hossain
(74) *Attorney, Agent, or Firm* — Cooper Legal Group, LLC

(57) ABSTRACT

Among other things, an inductor comprising a conductive trace and a method for forming the inductor are provided. The inductor comprises a magnetic structure, such as a ferrite core. A molding material, such as a dielectric, is formed around the magnetic structure. A conductive trace, comprising one or more conductive pillars interconnected by one or more upper interconnects and one or more lower interconnects, is formed around the magnetic structure to form the inductor. The conductive trace allows physical limitations associated with winding a wire to be avoided, and thus allows the inductor to be smaller than wire wound inductors. In one example, the inductor is formed within an integrated circuit package comprising an active device, such as an integrated circuit. In this way, the inductor can be connected to the integrated circuit within the integrated circuit package.

15 Claims, 9 Drawing Sheets

(51) Int. Cl.
*H01L 25/00* (2006.01)
*H01L 23/00* (2006.01)
*H01L 23/64* (2006.01)
*H01L 25/16* (2006.01)
*H01F 17/00* (2006.01)
*H01F 41/04* (2006.01)
*H01L 23/31* (2006.01)

(56) References Cited

U.S. PATENT DOCUMENTS

| | | | |
|---|---|---|---|
| 6,459,351 B1* | 10/2002 | Maki et al. | 336/200 |
| 6,657,298 B1* | 12/2003 | Glenn | H01L 21/565 |
| | | | 257/666 |
| 6,756,875 B2* | 6/2004 | Ahn et al. | 336/200 |
| 6,762,925 B2* | 7/2004 | Uchida | H03H 7/0115 |
| | | | 29/25.41 |
| 6,998,952 B2* | 2/2006 | Zhou et al. | 336/200 |
| 7,145,428 B2* | 12/2006 | Chiu | H05K 1/165 |
| | | | 257/E23.062 |
| 7,852,186 B2* | 12/2010 | Fouquet et al. | 336/200 |
| 8,217,748 B2* | 7/2012 | Feng et al. | 336/200 |
| 2003/0076666 A1* | 4/2003 | Daeche | H01L 21/4821 |
| | | | 361/813 |
| 2003/0137385 A1* | 7/2003 | Ahn et al. | 336/200 |
| 2004/0124961 A1* | 7/2004 | Aoyagi | 336/200 |
| 2007/0025092 A1* | 2/2007 | Lee | H01L 23/49822 |
| | | | 361/761 |
| 2007/0180684 A1* | 8/2007 | Wada et al. | 29/602.1 |
| 2009/0051025 A1 | 2/2009 | Yang et al. | |
| 2009/0079529 A1* | 3/2009 | Knott | H01F 17/0006 |
| | | | 336/90 |
| 2009/0180305 A1* | 7/2009 | Hashino et al. | 363/125 |
| 2011/0291785 A1* | 12/2011 | Lim et al. | 336/200 |
| 2012/0249282 A1* | 10/2012 | Sin et al. | 336/200 |

* cited by examiner

INDUCTOR WITH CONDUCTIVE TRACE

BACKGROUND

Inductors can be used for various applications, such as filters in circuits, energy storage components, reactors to depress voltage, switching current limiters, transformers, etc. In one example, a transformer can be formed from a first inductor and a second inductor. The transformer can transfer electrical energy from a first circuit to a second circuit using magnetic flux generated between the first inductor and the second inductor.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
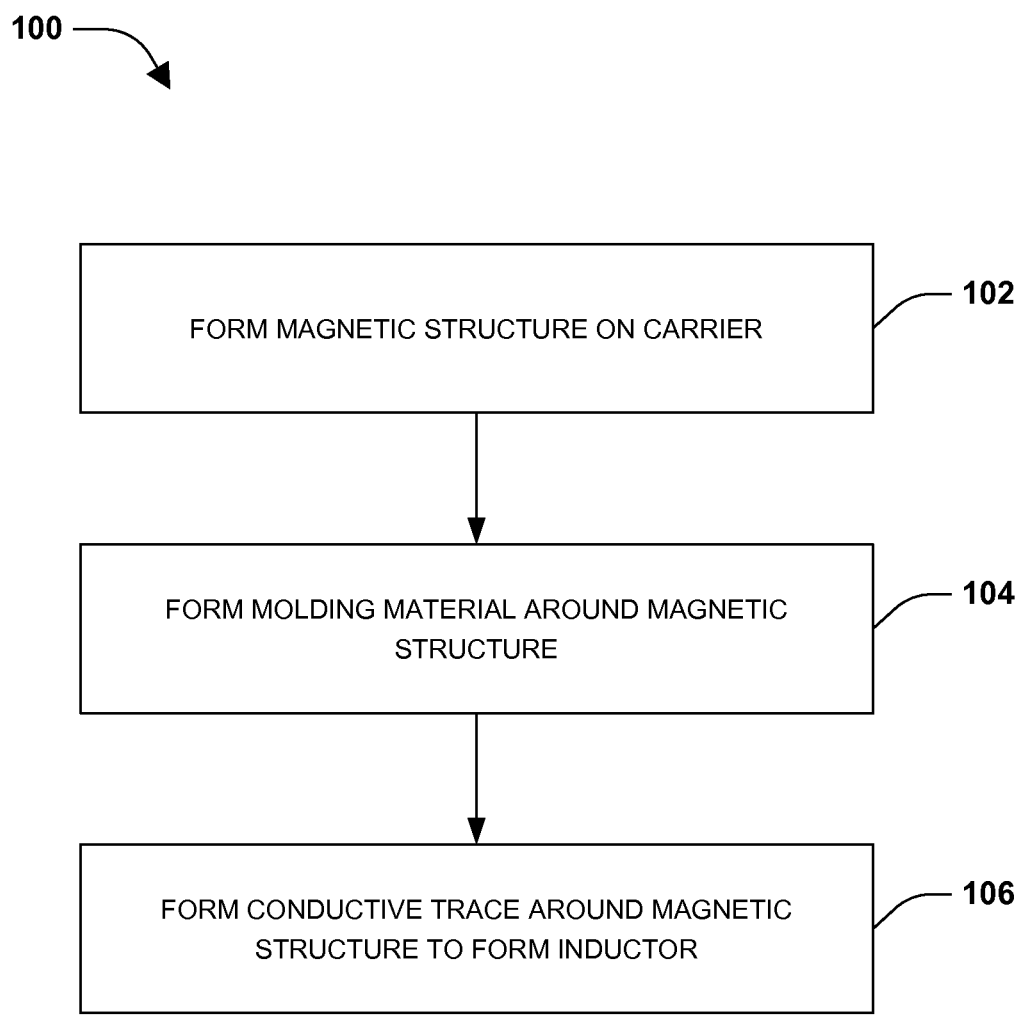
FIG. 1 is a flow diagram illustrating a method of forming an inductor, according to some embodiments.
Figure 2:
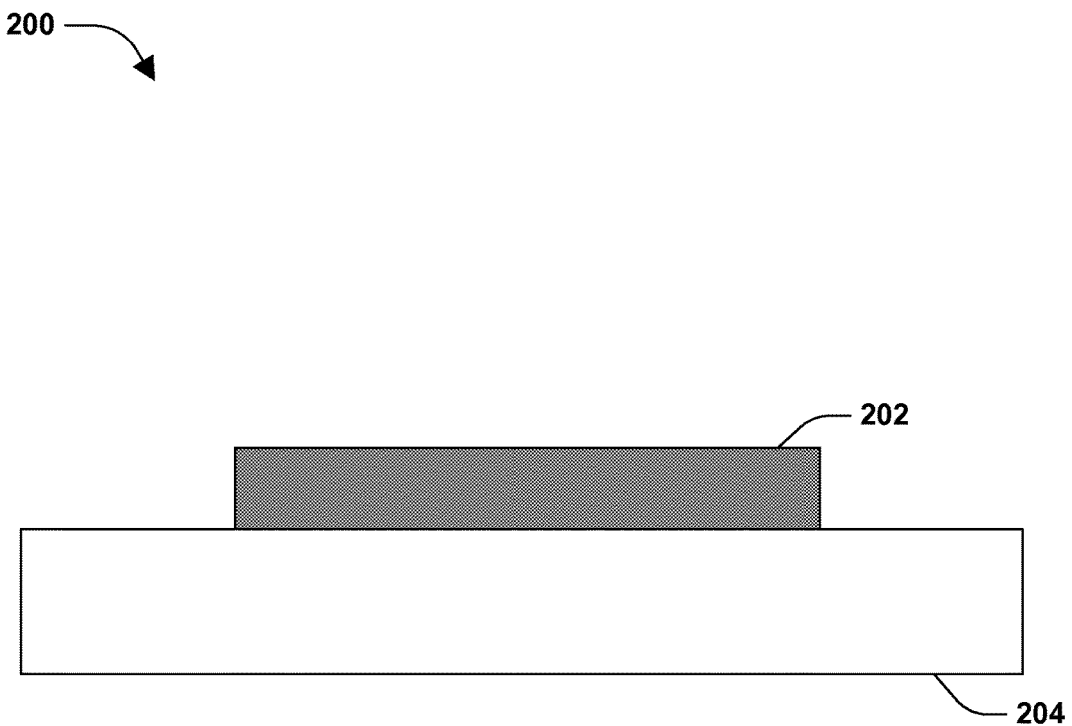
FIG. 2 is an illustration of a magnetic structure formed on a carrier, according to some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

As provided herein, a conductive trace is formed around a magnetic structure to form an inductor. In one example, the inductor is formed according to one more semiconductor fabrication techniques, such as chemical etching, photolithography, chemical injection, a chemical spin-on process, etc. Such techniques allow for the formation of relatively small inductors formed from conductive traces, as opposed to wires, so that the size of such inductors is not restricted to physical limitations of winding a wire. As such, one or more inductors can be formed within an integrated circuit package comprising one or more active devices. The one or more inductors formed within the integrated circuit package can replace the functionality of external inductors, such as transformers, that would otherwise have to be placed external to the integrated circuit package, such as within a printed circuit board.

Accordingly, an embodiment of forming an inductor is illustrated by an exemplary method 100 in FIG. 1, and exemplary inductors formed by such a methodology are illustrated in FIGS. 2-7. At 102, a magnetic structure 202 is formed on a carrier 204, as illustrated in example 200 in FIG. 2. The magnetic structure 202 can comprise various materials, such as a ferrite material or other material that supports generation of a magnetic field. The magnetic structure 202 can be formed according to various configurations, such as a closed loop structure, an open core structure, a rod structure, etc. In some embodiments, a length or a diameter of the magnetic structure is in the range from about 0.1 millimeters to about 10 millimeters.

Figure 3A:
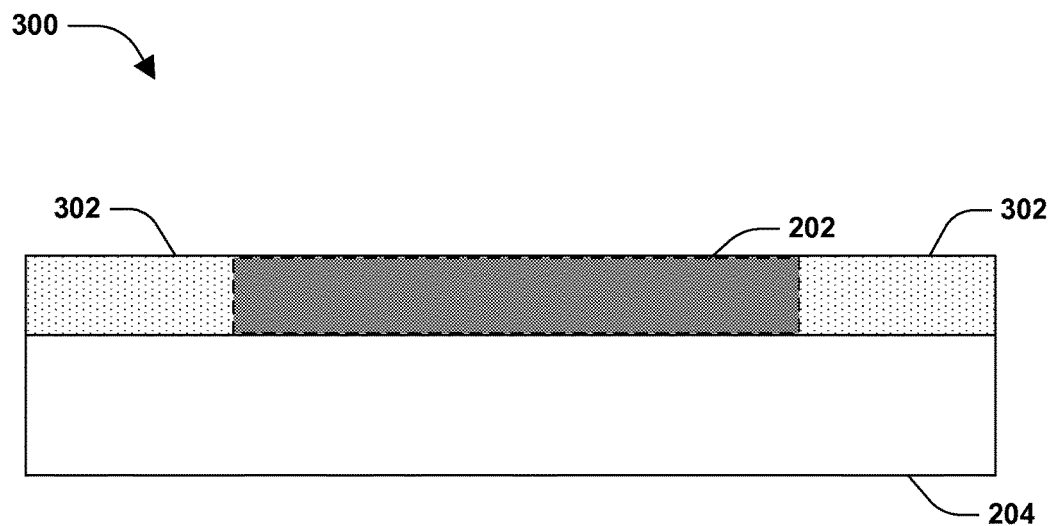
FIG. 3A is an illustration of molding material formed around a magnetic structure taken along line 312 of FIG. 3B, according to some embodiments.
Figure 3B:
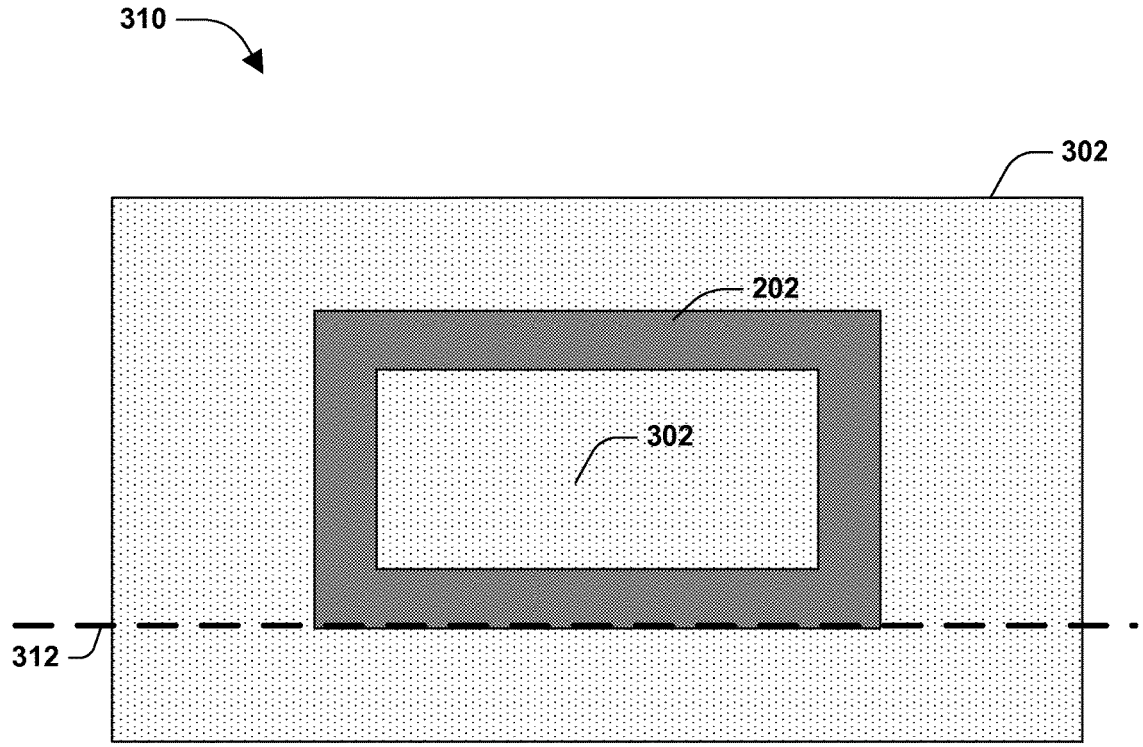
FIG. 3B is an illustration of molding material formed around a magnetic structure, according to some embodiments.

At 104, a molding material 302 is formed around the magnetic core structure 202, as illustrated in example 300 of FIG. 3A and example 310 of FIG. 3B. It will be appreciated that FIG. 3A illustrates a cross-sectional view of FIG. 3B taken along line 312. The molding material 302 can comprise a dielectric material, such as silicon based material, that provides electrical isolation between the magnetic structure 202 and other structures formed on the carrier 204. The molding material 302 can be formed according to various formation techniques, such as a spin-on process, a deposition process, or an injection process. In one example, the magnetic structure 202 comprises a closed loop, such that the molding material 302 is formed around the outside of the closed loop and within the inside of the closed loop.

Figure 6A:
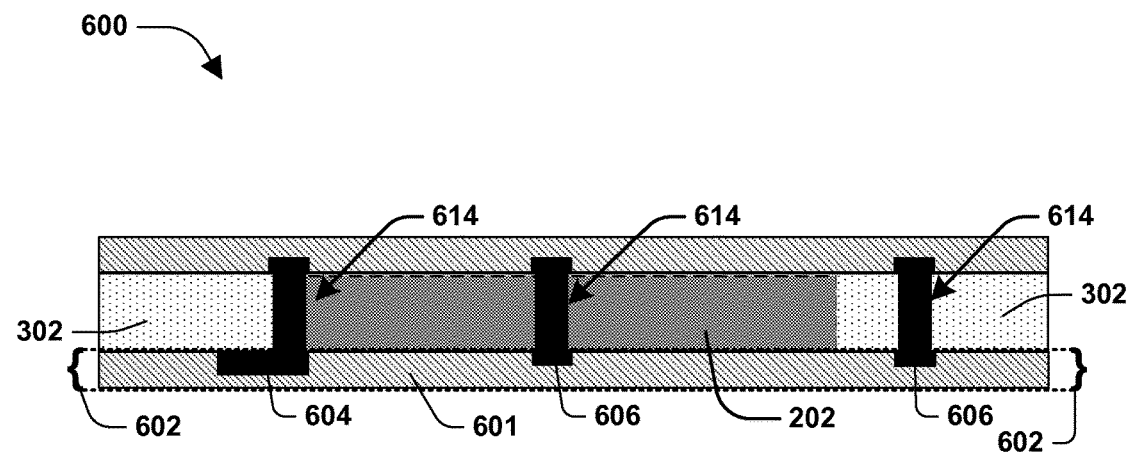
FIG. 6A is an illustration of one or more lower interconnects formed within a lower redistribution layer formed below a molding material, according to some embodiments.
Figure 6B:
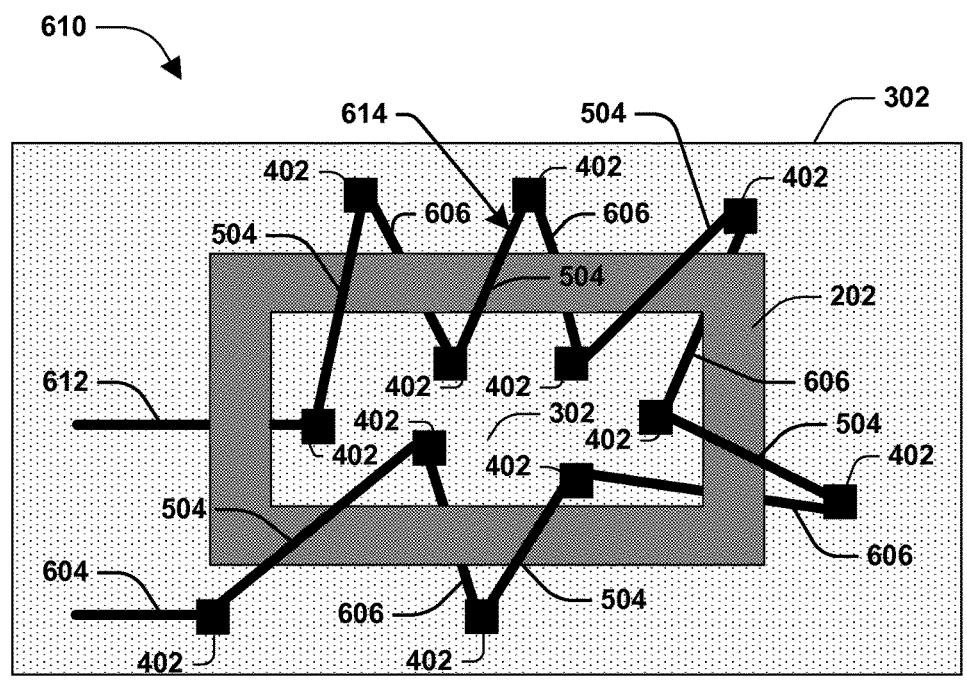
FIG. 6B is an illustration of one or more lower interconnects formed within a lower redistribution layer formed below a molding material, according to some embodiments.
Figure 7:
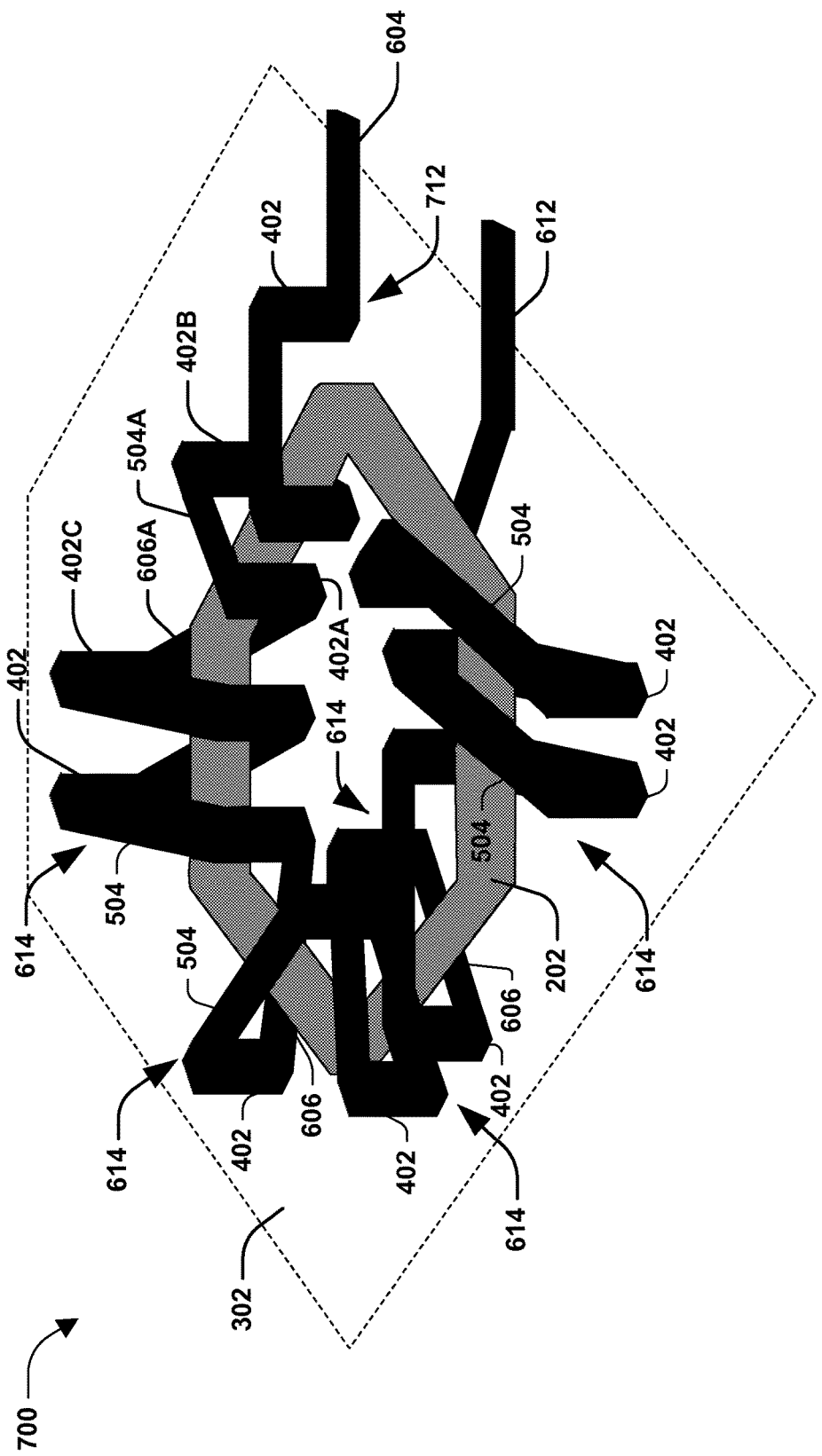
FIG. 7 is an illustration of an inductor, according to some embodiments.

At 106, a conductive trace 614 is formed around the magnetic structure 202 to form an inductor, as illustrated in example 600 of FIG. 6A, example 610 of FIG. 6B, and example 700 of FIG. 7. The conductive trace 614 can comprise various conductor materials, such as copper, for example. The conductive trace 614 can be formed using various semiconductor fabrication techniques so that the conductive trace 614 is not limited to a physical wire with physical winding limitations.

Figure 4A:
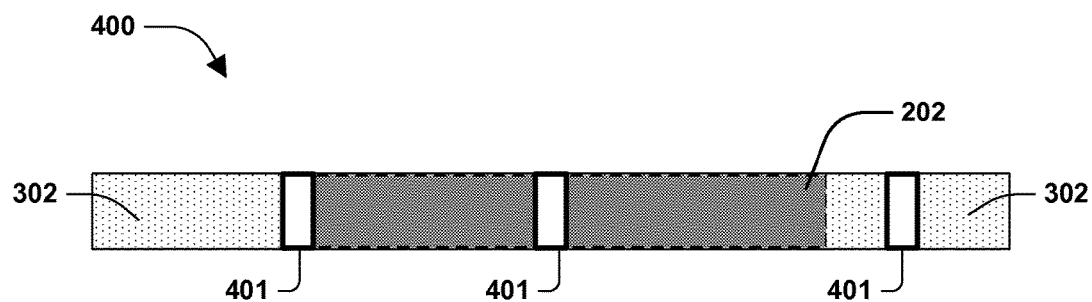
FIG. 4A is an illustration of one or more holes formed within a molding material, according to some embodiments.
Figure 4B:
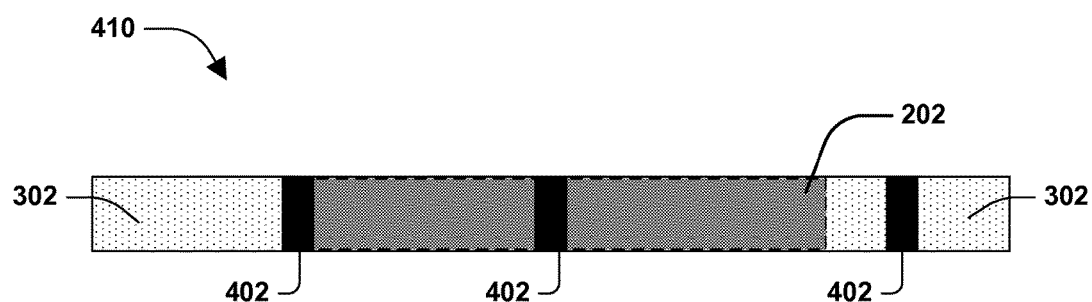
FIG. 4B is an illustration of one or more conductive pillars formed within a molding material, according to some embodiments.
Figure 4C:
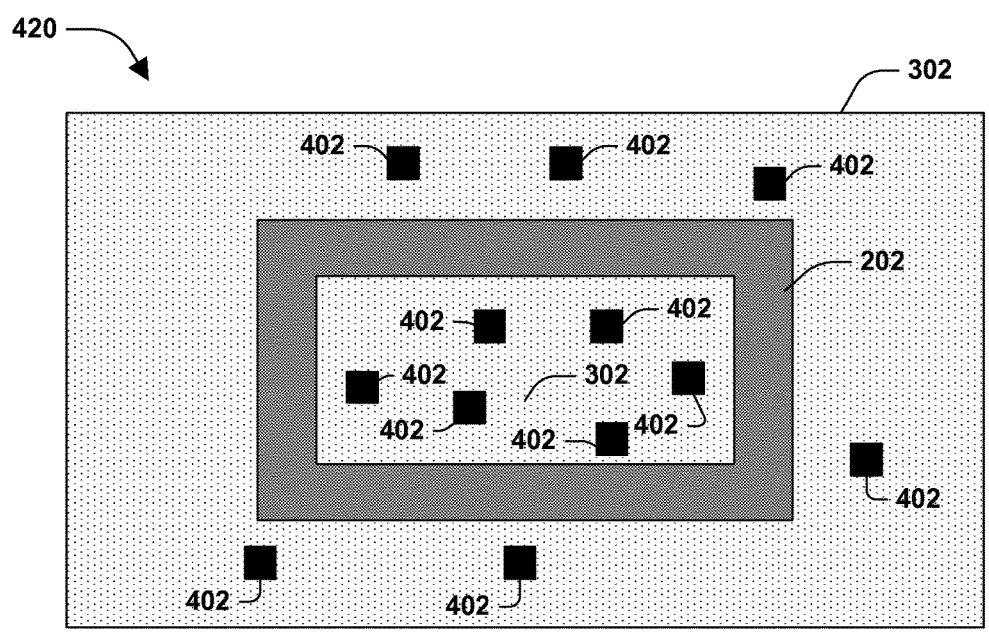
FIG. 4C is an illustration of one or more conductive pillars formed within a molding material, according to some embodiments.

In an embodiment of forming the conductive trace 614, one or more holes, such as holes 401, are formed through the molding material 302, as illustrated by example 400 of FIG. 4A. It will be appreciated that any number of holes can be formed, and that holes 401 and other holes not labeled are merely shown for illustrative purposes. Various techniques, such as photolithography, etching, etc. can be utilized to form the one or more holes through the molding material 302. A conductive material is instilled or introduced into the one or more holes, such as by deposition, for example, to form one or more conductive pillars 402, as illustrated by example 410 of FIG. 4B and example 420 of FIG. 4C. The one or more conductive pillars are formed as at least a portion of the conductive trace 614.

Figure 5A:
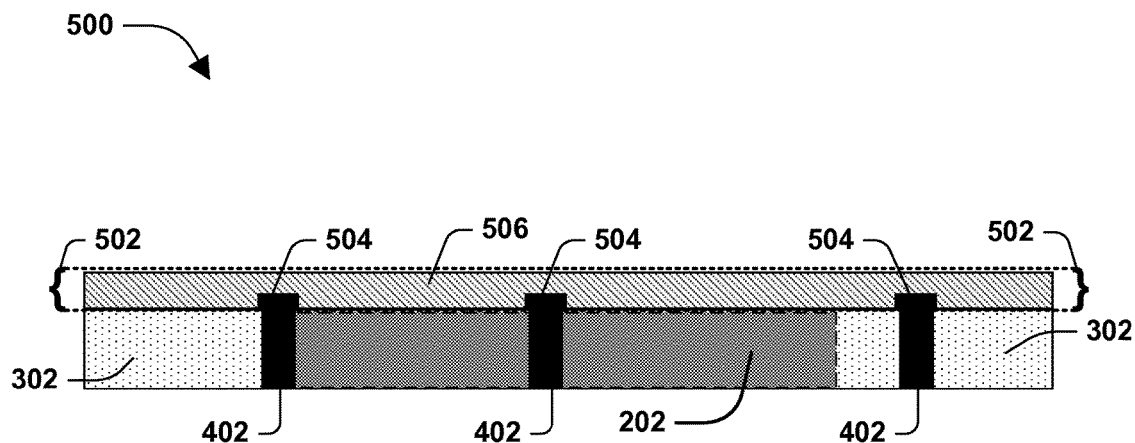
FIG. 5A is an illustration of one or more upper interconnects formed within an upper redistribution layer formed above a molding material, according to some embodiments.
Figure 5B:
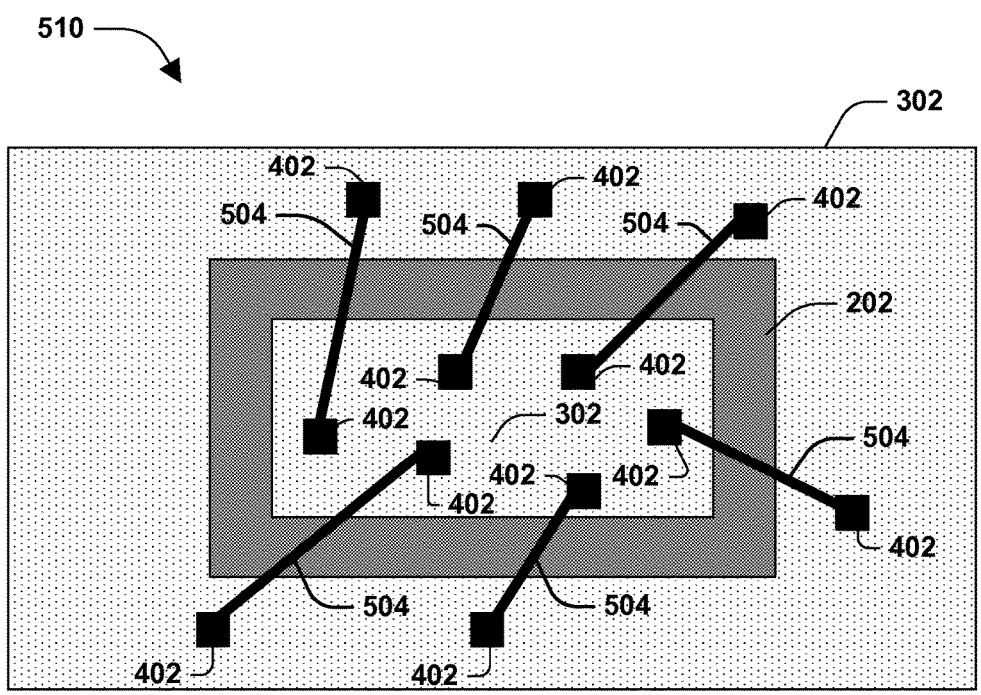
FIG. 5B is an illustration of one or more upper interconnects formed within an upper redistribution layer formed above a molding material, according to some embodiments.

One or more upper interconnects, such as upper interconnects 504, are formed, such as by etching, for example, into an upper redistribution layer formed within an upper redistribution structure 502 formed above the molding material 302, as illustrated in example 500 of FIG. 5A and example 510 of FIG. 5B. It will be appreciated that the upper redistribution structure 502 is shown in example 500 of FIG. 5A, but is not shown in example 510 of FIG. 5B for illustrative purposes. The upper redistribution structure 502 comprises a passivation layer 506 and the upper redistribution layer within which the upper interconnects 504 are formed. In some embodiments the passivation layer 506 comprises a dielectric material, such as a polymer comprising polybenzoxazole or other PBO material. In one example of an upper interconnect, a first upper interconnect 504A is positioned above the magnetic structure 202, and connects a first conductive pillar 402A with a second conductive pillar 402B, as illustrated in example 700 of FIG. 7. Conductive material is instilled into the one or more upper interconnects, such as by deposition, for example, thus forming electrical connections, above the magnetic core 202, between respective conductive pillars.

One or more lower interconnects, such as a first lower interconnect 604, second lower interconnect 612, and lower interconnects 606, are formed, such as by etching, for example, into a lower redistribution layer formed within a lower redistribution structure 602 formed below the molding material 302, as illustrated in example 600 of FIG. 6A and example 610 of FIG. 6B. It will be appreciated that the lower redistribution structure 602 is shown in example 600 of FIG. 6A, but is not shown in example 610 of FIG. 6B for illustrative purposes. The lower redistribution structure 602 comprises a passivation layer 601 and the lower redistribution layer within which the one or more lower interconnects are formed. In some embodiments the passivation layer 601 comprises a dielectric material, such as a polymer comprising polybenzoxazole or other PBO material. In one example of a lower interconnect, a first lower interconnect 606A is positioned below the magnetic structure 202, and connects the first conductive pillar 402A with a third conductive pillar 402C, as illustrated in example 700 of FIG. 7. Conductive material is instilled into the one or more lower interconnects, such as by deposition, for example, thus forming electrical connections, below the magnetic core 202, between respective conductive pillars. In this way, an inductor is formed from the one or more conductive pillars, the one or more upper interconnects, and the one or more lower interconnects.

It is to be appreciated that the inductor can be formed according to a variety of shapes, sizes, or configurations, and is not limited to merely the hexagonal shape illustrated in FIG. 7. In some embodiments, the diameter of the conductive trace 614 is in the range from about 0.1 microns to about 20 microns.

In one example, the first lower interconnect 604 is formed as a first connection to the inductor and the second lower interconnect 612 is formed as a second connection to the inductor. In this way, if the inductor is formed within an integrated circuit package, then the inductor can be connected to one or more active devices, such as integrated circuits, within the integrated circuit package using the first and second connections, as illustrated in example 900 of FIG. 9.

Figure 8:
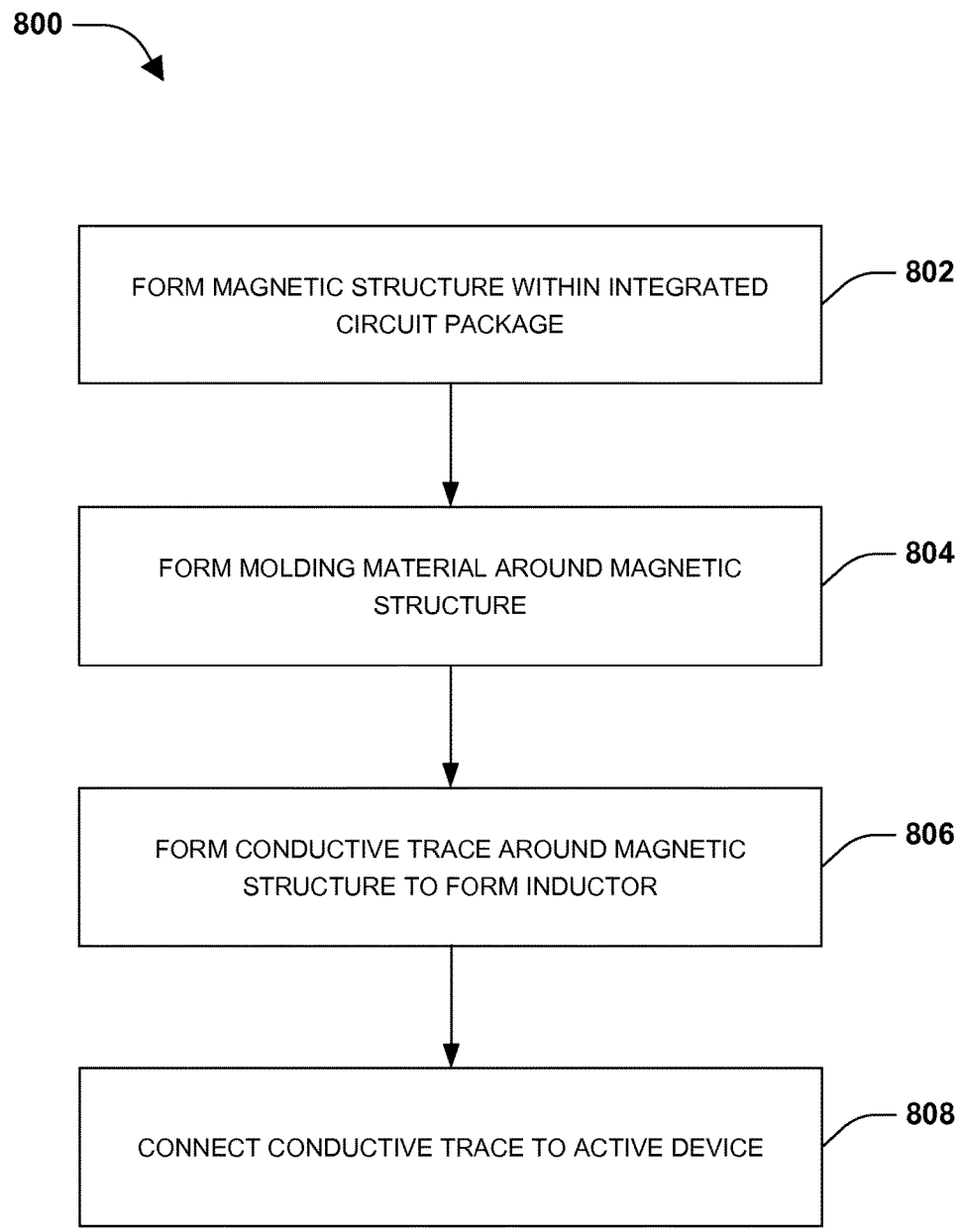
FIG. 8 is a flow diagram illustrating a method of forming an inductor within an integrated circuit package, according to some embodiments.
Figure 9:
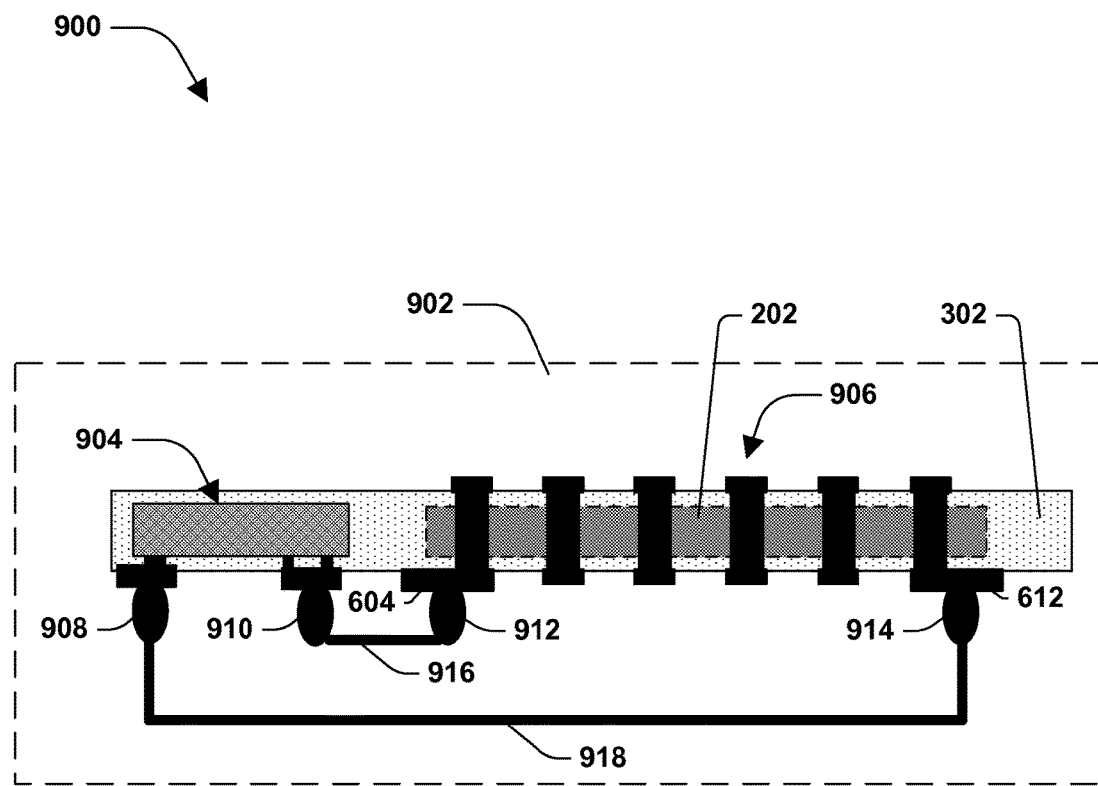
FIG. 9 is an illustration of an inductor formed within an integrated circuit package, according to some embodiments.

An embodiment of forming an inductor within an integrated circuit package is illustrated by an exemplary method 800 in FIG. 8, and an exemplary inductor 906 formed by such a methodology is illustrated in FIG. 9. At 802, a magnetic structure 202 is formed within an integrated circuit package 902. The integrated circuit package 902 comprises one or more active devices, such as active device 904. In one example, the active device 904 comprises an integrated circuit, such as a power managed integrated circuit. In some embodiments, a height of the integrated circuit package 902 is in the range from about 0.1 millimeters to about 1 millimeter.

At 804, molding material 302 is formed around the magnetic structure, such as by deposition, for example. In one example, the molding material is formed around at least a portion of the active device 904. The molding material comprises a dielectric layer that electrically insulates the magnetic structure 202 and the active device 904. At 806, a conductive trace is formed around the magnetic structure to form the inductor 906. In one example of forming the conductive trace, one or more holes are etched through the molding material. Conductive material is instilled into the one or more holes to form one or more conductive pillars. One or more upper interconnects are formed into an upper redistribution layer within an upper redistribution structure formed above the molding material. Conductive material is instilled into the one or more upper interconnects to form electrical connects, above the magnetic structure, between respective conductive pillars. One or more lower interconnects are formed into a lower redistribution layer within a lower redistribution structure formed below the molding material. Conductive material is instilled into the one or more lower interconnects to form electrical connects, below the magnetic structure, between respective conductive pillars. In this way, the inductor 906 is formed from the conductive trace comprising the one or more conductive pillars interconnected by one or more upper interconnects and one or more lower interconnects, such that the conductive trace wraps around the magnetic structure.

At 808, the inductor 906 is connected to the active device 904. In one example, a first ball mount 912 is connected to the conductive trace of the inductor 906 at a first position. A second ball mount 914 is connected to the conductive trace of the inductor 906 at a second position. The first ball mount 912 can be configured as a first inductor port, and can be connected, through a first connection 916 such as a metal line, for example, to third ball mount 910 of the active device 904. The second ball mount 914 can be configured as a second inductor port, and can be connected, through a second connection 918 such as a metal line, for example, to the fourth ball mount 908 of the active device 904. In some embodiments, the diameter of the first ball mount 912, the second ball mount 914, the third ball mount 910, or the fourth ball mount 908 is in the range from about 10 microns to about 50 microns.

In this way, the inductor 906 may provide various types of functionality for the active device 904. For example, the inductor 906 can be formed as a transformer configured to step up or step down voltage to the active device 904. In one example of the inductor 906, the inductor 906 can be formed according to a fan-out wafer structure. That is, the integrated circuit package 902 is formed as a first die within which the inductor 906 is formed as a second die, such that the inductor 906 extends out of or beyond the second die. For example, the first lower interconnect 604 and the second lower interconnect 612 formed within the lower redistribution layer extend out of the second die, such as beyond boundaries of the magnetic core structure 202 of the inductor 906.

As provided herein, an inductor is formed using a conductive trace formed around a magnetic structure. Because the conductive trace is used, physical limitations associated with winding a wire around the magnetic core can be avoided, and thus allows the inductor to be smaller than wire wound inductors. In this way, the inductor can be formed within an integrated circuit package comprising an active device, such as an integrated circuit. The inductor can be coupled to the integrated circuit within the integrated circuit package. For example, one or more inductors can be formed within the integrated circuit package as a transformer that is connected to the integrated circuit.

According to an aspect of the instant disclosure, an inductor is provided. The inductor comprises a magnetic structure formed within a molding material. A conductive trace is formed around the magnetic structure. The conductive trace comprises one or more conductive pillars formed within the molding material. The conductive trace comprises one or more upper interconnects formed within an upper redistribution layer formed above the molding material. A first upper interconnect is positioned above the magnetic structure and connects a first conductive pillar and a second conductive pillar. The conductive trace comprises one or more lower interconnects formed within a lower redistribution layer formed below the molding material. A first lower interconnect is positioned below the magnetic structure and connects the first conductive pillar and a third conductive pillar.

According to an aspect of the instant disclosure, an integrated circuit package comprising an inductor is provided. The integrated circuit package comprises an active device and a magnetic structure. A molding material is formed around the magnetic structure. A conductive trace is formed around the magnetic structure to from an inductor. The conductive trace is connected to the active device.

According to an aspect of the instant disclosure, a method for forming an inductor is provided. The method comprises forming a magnetic structure on a carrier. A molding material is formed around the magnetic structure. A conductive trace is formed, within the molding material, around the magnetic structure to form the inductor.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as electro chemical plating (ECP), etching techniques, wet remove techniques, implanting techniques, doping techniques, spin-on techniques, sputtering techniques such as magnetron or ion beam sputtering, growth techniques, such as thermal growth, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. An integrated circuit package comprising:
   a molding material;
   an inductor comprising:
      a magnetic structure embedded within the molding material; and
      a conductive trace formed around the magnetic structure, the conductive trace comprising:
         one or more conductive pillars formed within and in direct contact with the molding material;
         one or more upper interconnects formed within an upper redistribution layer formed above the molding material and having a planar top surface, a first upper interconnect of the one or more upper interconnects positioned above the magnetic structure and connecting a first conductive pillar of the one or more conductive pillars and a second conductive pillar of the one or more conductive pillars; and
         one or more lower interconnects formed within a lower redistribution layer formed below the molding material, a first lower interconnect of the one or more lower interconnects positioned below the magnetic structure and connecting the first conductive pillar and a third conductive pillar of the one or more conductive pillars; and
   an active device embedded within the molding material and electrically coupled to the inductor, the active device laterally disposed and co-planar with the magnetic structure.

2. The integrated circuit package of claim 1, the molding material comprising a dielectric.

3. The integrated circuit package of claim 1, the magnetic structure configured as at least one of a closed loop structure, an open core structure, or a rod structure.

4. The integrated circuit package of claim 1, the conductive trace comprising copper.

5. The integrated circuit package of claim 1, comprising:
   a first connector configured to connect the inductor to the active device; and
   a second connector configured to connect the inductor to the active device.

6. The integrated circuit package of claim 1, the active device comprising a power management integrated circuit, and the inductor configured to at least one of step up voltage or step down voltage to the power management integrated circuit.

7. The integrated circuit package of claim 1, comprising:
 a first ball mount connected to the conductive trace at a first position; and
 a second ball mount connected to the conductive trace at a second position.

8. The integrated circuit package of claim 1, at least some of the one or more conductive pillars having a diameter of about 0.1 microns to about 20 microns.

9. The integrated circuit package of claim 1, the inductor formed according to a fan-out wafer structure.

10. The integrated circuit package of claim 1, the integrated circuit package having a height of about 0.1 millimeters to about 1 millimeter.

11. An integrated circuit package, comprising:
 a molding material;
 an inductor comprising:
  a magnetic structure;
  one or more conductive pillars formed around the magnetic structure and in direct contact with the molding material;
  an upper redistribution structure formed on top of the molding material and the magnetic structure and having a planar top surface, the upper redistribution structure comprising an upper interconnect connecting a first conductive pillar of the one or more conductive pillars to a second conductive pillar of the one or more conductive pillars, the second conductive pillar positioned on a diametrically opposite side of the magnetic structure relative to the first conductive pillar; and
  a lower redistribution structure formed on a bottom of the molding material and the magnetic structure, the lower redistribution structure comprising a lower interconnect connecting the first conductive pillar to a third conductive pillar of the one or more conductive pillars, the third conductive pillar positioned on the diametrically opposite side of the magnetic structure relative to the first conductive pillar; and
 an active device laterally disposed and co-planar with the magnetic structure.

12. The integrated circuit package of claim 11, a height of the molding material substantially equal to a height of the magnetic structure.

13. The integrated circuit package of claim 11, the upper redistribution structure comprising a dielectric material into which the upper interconnect is formed.

14. The integrated circuit package of claim 11, the active device embedded within the molding material.

15. The integrated circuit package of claim 11, at least some of the one or more conductive pillars having a diameter of about 0.1 microns to about 20 microns.

* * * * *